United States Patent
Huang

(10) Patent No.: US 12,027,658 B2
(45) Date of Patent: Jul. 2, 2024

(54) PHOTOELECTRIC APPARATUS

(71) Applicant: SeeYA Optronics Co., Ltd., Shanghai (CN)

(72) Inventor: Zhongshou Huang, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 365 days.

(21) Appl. No.: 17/536,428

(22) Filed: Nov. 29, 2021

(65) Prior Publication Data

US 2023/0121142 A1 Apr. 20, 2023

(30) Foreign Application Priority Data

Oct. 14, 2021 (CN) .......................... 202111196751.1

(51) Int. Cl.
*H01L 33/64* (2010.01)
*H01L 31/0232* (2014.01)
*H01L 31/024* (2014.01)
*H01L 33/58* (2010.01)

(52) U.S. Cl.
CPC .......... *H01L 33/64* (2013.01); *H01L 31/0232* (2013.01); *H01L 31/024* (2013.01); *H01L 33/58* (2013.01); *H01L 33/645* (2013.01)

(58) Field of Classification Search
None
See application file for complete search history.

(56) References Cited

U.S. PATENT DOCUMENTS

| | | | |
|---|---|---|---|
| 2005/0116336 A1* | 6/2005 | Chopra | H01L 23/373 257/E23.11 |
| 2005/0243237 A1* | 11/2005 | Sasuga | F21V 14/003 349/57 |
| 2007/0273265 A1* | 11/2007 | Hikmet | C09K 11/08 313/483 |
| 2012/0018754 A1* | 1/2012 | Lowes | G02F 1/1334 257/E33.059 |
| 2015/0021477 A1* | 1/2015 | Cassaigne | C22C 5/04 250/338.1 |

* cited by examiner

*Primary Examiner* — Evren Seven
(74) *Attorney, Agent, or Firm* — Kolitch Romano Dascenzo Gates LLC

(57) ABSTRACT

A photoelectric apparatus comprises a barrel-shaped container, an optical lens and a photoelectric imaging device arranged at two ends of the container, respectively. The container is filled with a light-transmitting and heat-conductive liquid. The heat-conductive liquid contains a plurality of nanostructures and particularly includes a plurality of nanorods. When an external voltage is applied between the photoelectric imaging device and the container, the nanorods are aligned with the electric field lines created by the external voltage, and form into nanorod chains. The nanorod chains link the photoelectric imaging device and the container, thereby increase the thermal conductivity of the heat-conductive liquid, and hence improve the heat dissipation efficiency of the photoelectric apparatus.

15 Claims, 8 Drawing Sheets

PHOTOELECTRIC APPARATUS

CROSS-REFERENCE TO RELATED APPLICATIONS

This application is based upon and claims priority to Chinese Patent Application No. 202111196751.1, filed on Oct. 14, 2021, the entire contents of which are incorporated herein by reference.

TECHNICAL FIELD

The present disclosure relates to a photoelectric apparatus.

BACKGROUND

Photoelectric apparatuses are electrical-to-optical or optical-to-electrical transducers, or instruments that use such apparatuses in their operation. The photoelectric apparatus may include an optical image output device, which is commonly referred to an electronic display, and it may also include an optical image input device, which is commonly referred to an image sensor or an image capture device. The optical image mentioned here can be in one-dimensional, two-dimensional, or three-dimensional. Photoelectric apparatus often further includes certain optical systems, especially the optical lens that can image the input optical image on the imaging device, or the optical lens that can project the optical image from the display onto a screen. FIG. 1 shows a schematic diagram of a photoelectric apparatus in the related art, the reference sign 10 refers to the display as an image output device, or alternatively refers to a camera chip as an image input device. For the sake of simplicity, a photoelectric imaging device hereinafter refers to the display as the image output device or the camera chip as the image input device. The photoelectric imaging device is usually fixed on a printed circuit board (PCB) with signal input/output circuits, image data storage and processing chips, related circuits, power supply as well as control circuits. The photoelectric apparatus also includes an optical lens 30 close to the photo electric imaging device and an aperture structure 32 that defines the solid angle of light beam 20 passing through, as shown in FIG. 1. The whole optical system is fixed in a box 12. In addition, FIG. 1 also shows a principal image plane 31 of an optical lens 30 (referred to the principal plane of the optical lens). Whether the optical lens 30 is a bi-convex lens or a plano-convex lens, their refraction effect is equivalent to the refraction on the principal plane, which can simplify the process of analyzing the light ray in the lens system. In all photoelectric imaging systems, such as a CCD (Charge-Coupled Device) camera, or a display system, such as a micro-display in AR (Augmented Reality) glasses, the space 21 of the box 12 is usually filled with air. For both the manufacturing process of the various parts of the photoelectric apparatuses, and the later process of assembling or encapsulating the various parts in the box, the structure of photoelectric apparatus in FIG. 1 is the easiest one to implement.

However, with the development of mobile communication, especially the technical development and application of display devices and image capture devices of wearable apparatus, the heat dissipation problem of optical apparatus with the conventional structure has become more and more serious. Specifically, for example, in the application of VR (Virtual Reality) glasses and AR glasses, to be more portable, photoelectric apparatuses with smaller size, lighter weight and more compact packaging are required. Besides, people pursue images with higher brightness, higher resolution and higher color saturation, 3D images, or video images with higher frame rates, which all increase the power consumption of apparatus. These performance demands make it extremely difficult to quickly dissipate heat in a small space. As the consequence, limiting the system temperature below a level that the system or the human body can withstand become quite challenging. The uncomfortable hot temperature for hands is around 50 degrees Celsius, and the uncomfortable hot temperature of human forehead or face eyes when wearing the wearable apparatus is approximately 40 degrees Celsius. In addition, in an extreme environment, such as outdoors in summer, poor heat dissipation often leads to rapid degradation of the performance of the organic light-emitting diode (OLED) displays, or system malfunction and even chip burning.

Therefore, providing a new approach to solve the heat dissipation problem mentioned above is the primary objective of the present disclosure, which is expected to improve the performance and expand the market of the display or the image capture devices for the wearable apparatus.

SUMMARY

In order to solve the above technical difficulties, the present disclosure provides a photoelectric apparatus integrating an optical lens and a photoelectric imaging device, that is, a photoelectric imaging device and an optical lens are respectively placed at two ends of a closed barrel-shaped container filled with a light-transmitting and heat-conductive liquid. The photoelectric imaging device may be an image sensor or a display. When the photoelectric imaging device is an image sensor, the image sensor collects light passing through the optical lens and the heat-conductive liquid from outside of the container. When the photoelectric imaging device is a display, the optical lens collects the optical image from the display and output it to the outside of the container. The photoelectric imaging device is configured by a functional layer and a transparent protecting layer stacked on the functional layer. The heat-conductive liquid is in contact with the optical lens and the transparent protecting layer, respectively. The heat-conductive liquid contains a plurality of nanostructures which are randomly and uniformly dispersed in the heat-conductive liquid. In this status, the thermal conductivity of the liquid is essentially dominated by the Brownian motion of the liquid molecules and the Brownian motion of the nanostructures, which is a heat exchanging mechanism with lower thermal conductivity. After a voltage is applied between the photoelectric imaging device and the barrel-shaped container by a power module, the spatial morphology of the nanostructures in the heat-conductive liquid is changed. Specifically, as an electric field is built up in the heat-conductive liquid, electric field lines are formed between the photoelectric imaging device and the chamber wall of the barrel-shaped container. The nanostructures are rearranged along the electric field lines into end-to-end chains, which can efficiently conduct heat and deliver the heat generated by the photoelectric imaging devices to the environment. Therefore, the thermal conductivity of the heat-conductive liquid is greatly improved, making it more suitable for the application of wearable optoelectronic apparatuses, such as AR apparatus or VR apparatus.

It should be readily understood that both the foregoing general description and the following detailed description are exemplary and explanatory only, and are not intended as a limitation to the scope of the present disclosure.

BRIEF DESCRIPTION OF THE DRAWINGS

The foregoing and other features, and advantages of the invention are apparent from the following detailed description taken in conjunction with the accompanying drawings in which.

DETAILED DESCRIPTION

In the following, embodiments of the present disclosure will be described in detail with reference to the figures. It should be understood that, the embodiments described hereinafter are only used for explaining the present disclosure, and should not be understood to limit the present disclosure. Besides, for describing the embodiments more clearly, the figures only show some aspects, instead of every aspect, of the present disclosure.

The "first", "second" and similar words used in the present disclosure do not denote any order, quantity or importance, but are only used to distinguish different components. "comprise", "include" and other similar words mean that the elements or objects appearing before these words, the elements or objects listed after these words, and their equivalents, but other elements or objects are not excluded. Similar words such as "connected" are not limited to physical or mechanical connections, but may include electrical connections, whether direct or indirect. "up", "down", etc. are only used to indicate the relative position relationship. When the absolute position of the described object changes, the relative position relationship may also change accordingly.

Figure 1:
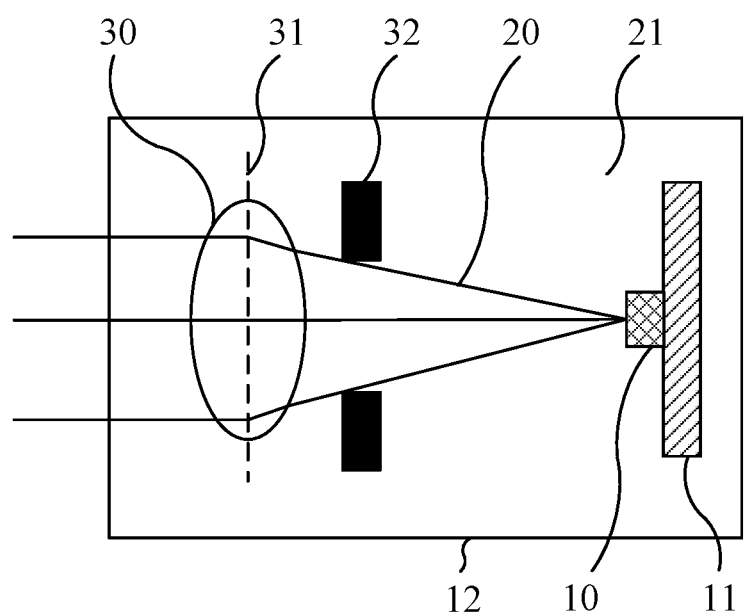
FIG. 1 is a schematic diagram of a photoelectric apparatus in the related art.
Figure 2:
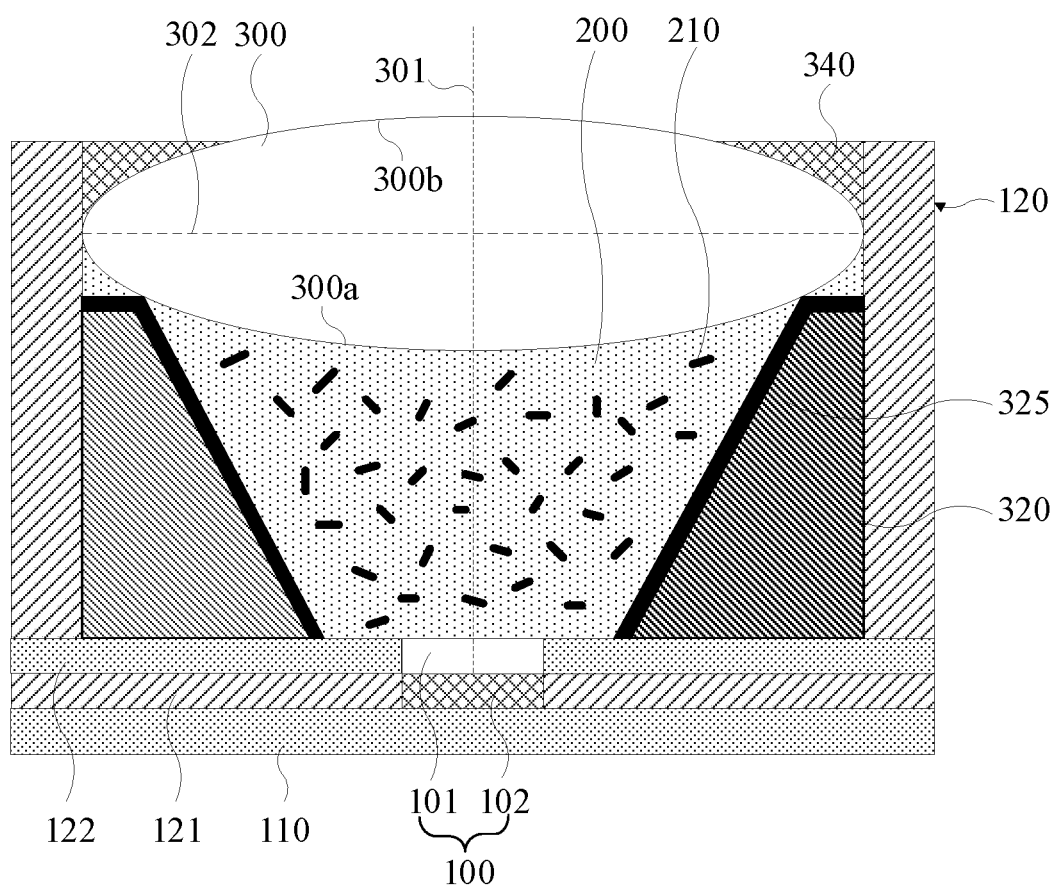
FIG. 2 is a schematic diagram of a photoelectric apparatus with no voltage applied by a power module according to a first embodiment of the present disclosure.

FIG. 2 shows a schematic diagram of a photoelectric apparatus of a first embodiment. In the first embodiment, the present disclosure provides a photoelectric apparatus, which includes a barrel-shaped container 120, an optical lens 300 and a photoelectric imaging device 100 respectively arranged at the two ends of the container 120. The container 120 is filled with a light-transmitting and heat-conductive liquid 200, and the heat-conductive liquid 200 contains a plurality of nanostructures. One side 300a of the optical lens 300 is in contact with the conductive liquid 200. For example, the optical lens 300 may be a converging object lens. In this embodiment, the optical lens 300 is a bi-convex lens, having two convex surfaces 300a, 300b arranged oppositely. In some embodiments, the convex surface 300a is the side that is adjacent to or contacts the heat-conductive liquid. As shown in FIG. 2, if the two convex surfaces have a same kind of radius of curvature, and are arranged rotationally symmetrically along an optical axis 301, and an optical principal plane of the optical lens 300 is also the plane where the long axis 302 of the convex lens is located. In all embodiments described in the present disclosure, to meet the requirements of different optical systems, the optical lens 300 can also be other types of lenses or combination of lenses, for example, it can be a plano-convex lens, a bi-concave lens, a plano-concave lens, a plano lens (such as a transparent flat cover), or a compound lens comprising at least two lens elements (e.g., two thin lens elements), such as convex lens, concave lens and plano lens.

The photoelectric imaging device 100 includes a functional layer 102 and a transparent protecting layer 101, and the functional layer 102 is used for photo-electric conversion (in an image sensor) or electric-photo conversion (in a display). The transparent protecting layer 101 contacts the heat-conductive liquid 200. The transparent protecting layer 101 can be a transparent thin film or a glass cover, which protects the photoelectric imaging device from being contaminated by moisture or other detrimental substances. The principal plane is parallel to the functional layer 102 of the photoelectric imaging device 100, and the optical axis 301 of the optical lens 300 passes through the center of the functional layer 102. Here, the principal plane refers to an image plane where the light emitted from the center of the functional layer 102 (approximately equal to the focal point of the optical lens 300) is refracted by the optical lens 300 and becomes a parallel light beam. Based on geometric optics, the principal plane can also be referred as the principal object plane when the photoelectric imaging device 100 is a display.

The photoelectric imaging device 100 may be an image sensor such as a CCD image sensor, a CMOS (Complementary Metal Oxide Semiconductor) image sensor, or a display such as an OLED display, an inorganic LED (Light Emitting Diode) display, or the like. Specifically, when the photoelectric imaging device 100 is an image sensor, the functional layer 102 is photosensitive, external light beam will pass through the optical lens 300 and the heat-conductive liquid 200, and then interact with the functional layer 102. When the photoelectric image device 100 is a display, the functional layer 102 emits light, which passes through the heat-conductive liquid 200 and the optical lens 300, and then propagates into space outside of the container 120.

In some embodiments, the nanostructures include a plurality of nanorods 210. The nanorod 210 has a rod-like geometric shape, that its length is greater than its average diameter. In another embodiment, an average diameter-to-length ratio of the nanorods is less than 0.75. The length of the nanorod is preferably less than 200 nm, that is, half of the shortest wavelength of visible light (400 nm). The nanorods 210 can be made of metals, metal oxides or insulating materials. The metals are selected from a group including gold, silver, copper or aluminum, the metal oxides are selected from a group including titanium dioxide, aluminum oxide or copper monoxide, and the insulating materials are inorganic or organic insulating materials. Since visible light can diffract through the nanometer-sized nanorods 210, scattering or reflection rarely occurs, that is, the nanostructures basically do not interrupt the light propagation in the heat-conductive liquid 200 and normal functionalities of the photoelectric imaging device 100. As a matter of fact, the visible light transmittance of the heat-conductive liquid 200 can even exceed 90%.

In another alternative embodiment, the nanostructures further include a plurality of nanoparticles (e.g., nonspheres), preferably, a diameter of the nanoparticles is less than 200 nm so as not to interrupt the light propagation in the heat-conductive liquid 200. In addition, the volume ratio of the nanoparticles in the heat-conductive liquid 200 is smaller than the volume ratio of the nanorods 210 in the heat-conductive liquid 200. In an exemplary embodiment, the volume ratio of the nanoparticles in the heat-conductive liquid 200 and the volume ratio of the nanorods 210 in the heat-conductive liquid 200 is 1:10. By adding nanorods 210 and/or nanoparticles, the heat-conductive liquid 200 has a more uniform thermal conductivity. In the embodiments described hereinafter, the nanostructures may include nanorods and/or nanoparticles as well.

The heat-conductive liquid 200 filling in the container 120 not only needs a high thermal conductivity and a high transparency, but also needs a wide temperature range to be operated outdoor. In one embodiment, the main composition of the heat-conductive liquid 200 may be a deionized water or pure water, while in another specific embodiment, the heat-conductive liquid 200 is mixed with an antifreeze, in order to increase the operating temperature of the photoelectric apparatus. The antifreeze is preferably anticorrosive as well. The volume ratio of the antifreeze in the mixed solution is between 20% and 40%, the more the antifreeze, the lower the freezing point. In this way, the liquid inside the photoelectric apparatus of the present disclosure will not freeze even at minus 30 degrees Celsius. Wherein, the antifreeze may include at least one of the followings: methanol, ethanol, ethylene glycol, glycerol, diethylene glycol, etc. The molecular formula of methanol is CH3OH, the molecular formula of ethanol is C2H5OH, the molecular formula of ethylene glycol is C2H4(OH)2, the molecular formula of diethylene glycol is C4H10O3, and the molecular formula of glycerol, generally called glycerin, is C3H5(OH)3. In another embodiment, the main composition of the heat-conductive liquid 200 is a silicone oil with high thermal conductivity. The thermal conductivity of silicone oil is 2 W/mK or higher, the freezing point is as low as minus 50 degrees Celsius, and the vaporization point can exceed 100 degrees Celsius.

As shown in FIG. 2, the photoelectric apparatus further includes an aperture structure 320 arranged between the optical lens 300 and the photoelectric imaging device 100, the aperture structure 320 is immersed in the heat-conductive liquid 200. A light-passing hole is provided at the center of the aperture structure 320, and the surface of the light-passing hole is an inclined sidewall surface. A centric axis of the light-passing hole coincides with the optical axis 301 of the optical lens 300. The aperture structure defines a maximum angle of light ray from the optical lens 300 to the photoelectric imaging device 100. The aperture structure 320 is in close contact with the inner side wall of the container 120, so that the heat inside the container 120 can be efficiently transmitted to the space outside of the container. In addition, the aperture structure 320 also supports and fixes the optical lens 300 during assembly process, to ensure the distance between the optical lens 300 and the photoelectric imaging device 100 is substantially equal to the focal length of the optical lens 300. In another embodiment, a light-absorbing layer 325 is provided on the surface of the aperture structure 320 to reduce the light reflection. In FIG. 2, this light-absorbing layer 325 is coated on the inclined sidewall surface of the aperture structure 320. The light-absorbing layer 325 may be a black organic film, such as resin doped with nano-sized carbon powder, which can absorb light and provide some electrical conductivity and thermal conductivity. In another embodiment, the light-absorbing layer 325 may be a black or gray metal oxide layer, such as chromium oxide. The light-absorbing layer 325 may also be a film layer made of non-conductive materials deposited on the inclined surface of the aperture structure 320, such as black polyvinyl chloride (PVC), black resin, etc. As shown in FIG. 2, the aperture structure 320 is funnel-shaped, with narrow opening on the imaging device side and wide opening on the optical lens side. Nevertheless, the embodiments disclosed hereinafter may have different geometric shapes for the aperture structure and the liquid-filled container, to fit into different optical systems.

As shown in FIG. 2, the photoelectric apparatus further includes an insulating layer 122 located at the bottom of the barrel-shaped container 120, a metal plate 121, a PCB or flexible printed circuit (FPC) 110. One end of the barrel-shaped container 120 is sealed with a sealant 340, so that the heat-conductive liquid 200 is well kept in a sealed chamber of the container 120. In some embodiments, the insulating layer 122 is a transparent insulating layer. In other alternative embodiments, the bottom of the container 120 may be configured indifferent structures, which are still within the scope of the present invention. In this embodiment, the container 120 may be a round barrel, a square barrel or a container in various shapes, all of which fall within the scope of the present invention.

Figure 3:
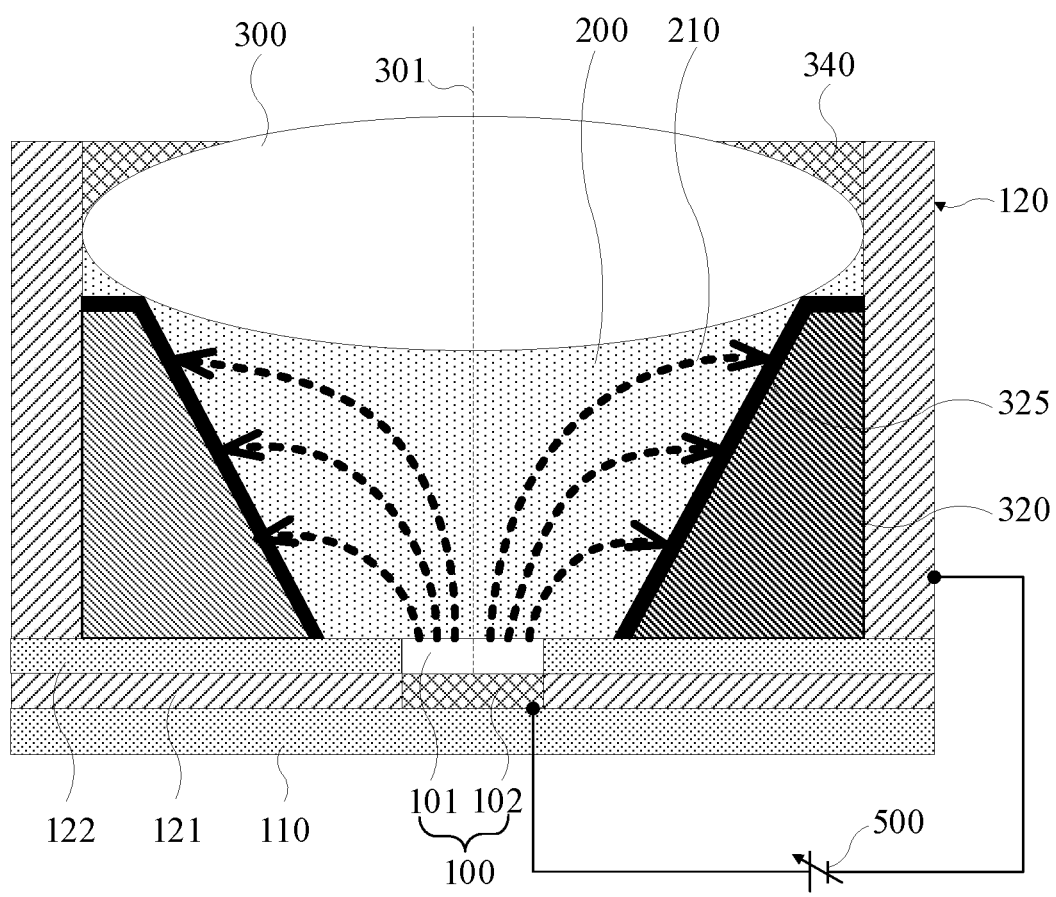
FIG. 3 is a schematic diagram of a photoelectric apparatus with voltage applied by a power module according to a first embodiment of the present disclosure.

Now referring to another embodiment shown in FIG. 3, the photoelectric apparatus in this embodiment further includes a power module 500 for applying a variable voltage between the photoelectric imaging device 100 and the barrel-shaped container 120, and the applied voltage will change the spatial morphology of the nanostructures 210 in the heat-conductive liquid 200. In this embodiment, the positive electrode of the power module 500 is connected to the substrate of the photoelectric imaging device 100, and the negative electrode is connected to the side wall of the container 120. A heat conduction mechanism conductive of the present disclosure is described below in conjunction with FIG. 2 and FIG. 3. As shown in FIG. 2, without a voltage between the photoelectric imaging device 100 and the barrel-shaped container 120, the nanorods 210 in the heat-conductive liquid 200 are random distributed. Specifically, the long axis of the nanorods 210 are randomly oriented in the liquid, without a specific tendency or order, in other words, they are in a chaotic status.

Figure 4:
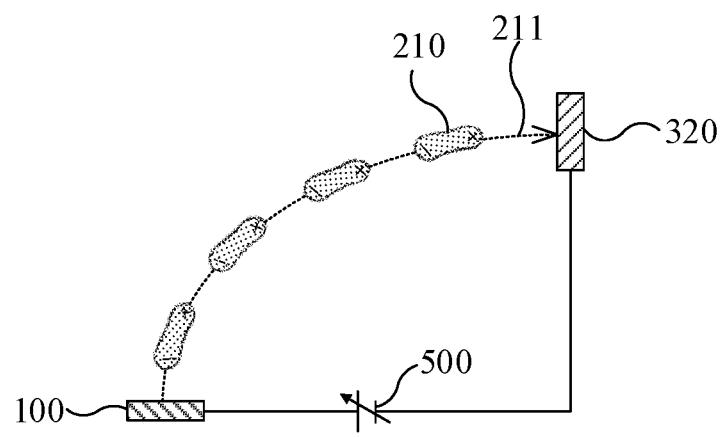
FIG. 4 is a schematic diagram of a photoelectric apparatus with nanostructures forming chain according to a first embodiment of the present disclosure.

When a positive voltage is applied between the photoelectric imaging device 100 and the side wall of the container 120 or the aperture structure 320, as shown in FIG. 3, a spatial electric field is formed due to the voltage. A group of electric field lines 211 are formed, which pass through the heat conductive liquid, conductive from the photoelectric imaging device 100 to the sidewall surface of the aperture structure 320. The nanorods 210 in the heat-conductive liquid 200 are polarized under the force the electric field, such that one end of the nanorod 210 is positively charged and another end is negatively charged. As the results of the polarization, as shown in FIG. 3 and FIG. 4, the nanorods 210 are rearranged along the electric field lines 211 into a group of end-to-end chains (i.e., in a manner of proximately a head-to-tail coupling). One ends of these chains link the transparent protecting layer 101, and the other ends touch on the surface coating layer (e.g., light-absorbing layer 325) of the aperture structure 320. Through these nanorod chains, the heat generated in the photoelectric imaging device 100 can be efficiently transmitted to the aperture structure 320 and the outer shell of the container 120. Since the aperture structure 320 and the outer shell of the container 120 are highly thermal conductive, resulting in highly efficient heat dissipation into space outside of the container 120.

Comparing FIG. 2 and FIG. 3, it can be seen that without a plurality of nanorod chains, the heat exchanging in the heat-conductive liquid can only rely on Brownian motion of nanorods or the liquid molecules conductive and thus the speed and the efficiency of heat exchanging of the heat-conductive liquid 200 is quite limited. After application of the external voltage, the speed and the efficiency of heat exchanging conductive are greatly improved due to the change of the spatial arrangement of the nanorods 210 (i.e., a chain formed by the nanorods 210), which makes the photoelectric apparatus of the present disclosure more suitable for the wearable photoelectric apparatuses, such as AR wearable photoelectric apparatuses, and VR wearable photoelectric apparatuses, etc.

Depending on the strength of the electric field and the density of the nanorod in the heat-conductive liquid, the nanorod chains may include gaps between adjacent nanorods. Nevertheless, the gaps will be much smaller than the average distance between each adjacent nanorod in the chaotic status. Heat exchanging can be realized through short-distance vibration or the Brownian motion, and therefore the thermal conductivity can be improved from the chaotic status as illustrated in FIG. 2.

Both the container 120 and the aperture structure 320 can be made of metal, ceramics with good thermal conductivity, or plastic/resin with good thermal conductivity. Preferably, the thermal conductivities of the body of the container 120 and the aperture structure 320 are greater than that of the heat-conductive liquid 200, for a better heat dissipation. In addition, the external surface area of the container 120 is made much larger than the surface area of the photoelectric imaging device 100 that is in contact with the heat-conductive liquid, which further improves the heat dissipation efficiency of the photoelectric apparatus.

In addition, in some embodiments, the heat-conductive liquid further contains dispersants, such as citrate, to make the nanorods uniformly dispersed in the heat-conductive liquid 200. By adding citrate into the liquid, the nanorods 210 will carry negative charges in the heat-conductive liquid 200, so that the nanorods 210 will repel each other and will not form clusters. Therefore, the heat-conductive liquid remains uniform and transparent for 400 nm to 760 nm visible light conductive. When an electric field is applied in the heat-conductive liquid, the negative charges on the nanorods 210 are redistributed, that negative charges tend to move to one end of the nanorod 210, the nanorods are polarized. Once the nanorods are polarized, their long axis will align with the electric field lines, forming nanorod chains as illustrated in FIG. 3. Further, in order to enhance the polarization effect, in one embodiment, nanorods with an asymmetrical shape are used, that is, an average diameter of the nanorod is larger on one end while smaller on another end. For example, the first ends of the nanorods are thick, but the second ends are thin. In the electric field, the surface charges on the nanorods in asymmetric shape tend to redistribute along the long axis unevenly, resulting in an enhanced polarization. This will be beneficial to forming end-to-end nanorod chains (i.e., head to tail coupling).

Figure 5:
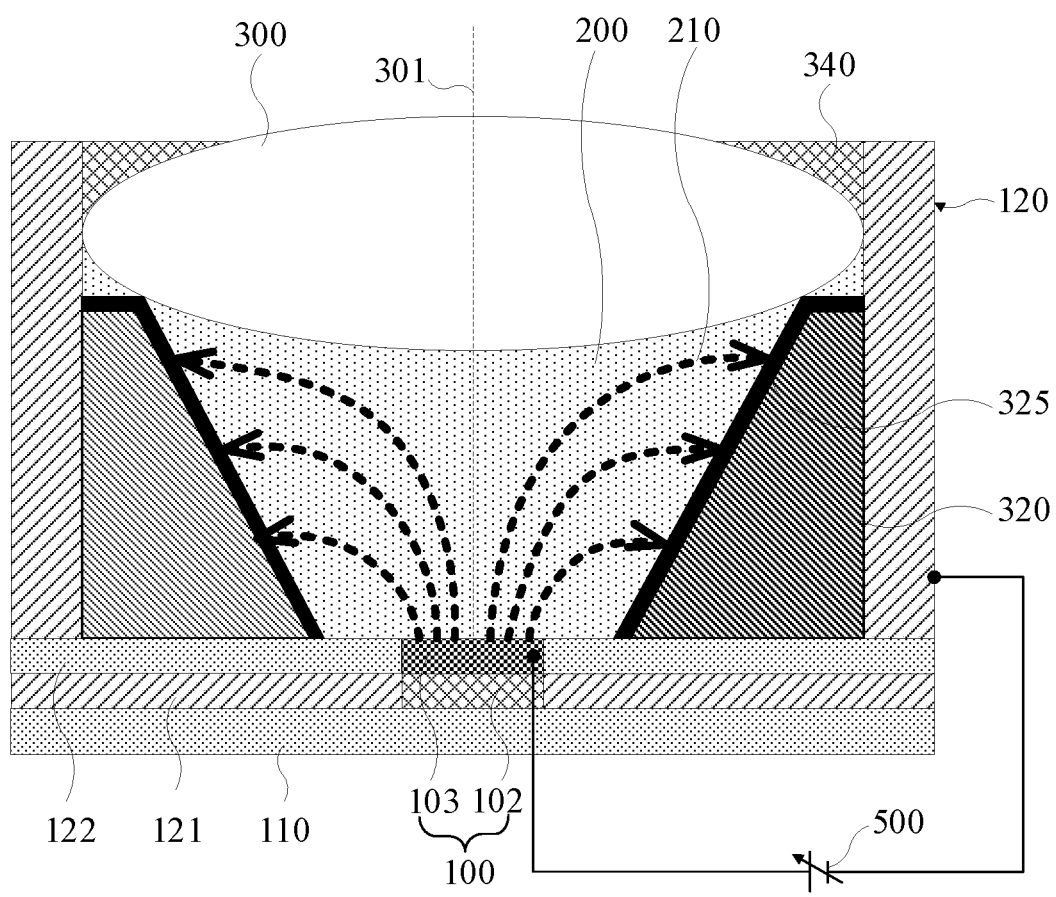
FIG. 5 is a schematic diagram of a photoelectric apparatus of a second embodiment of the present disclosure.

FIG. 5 is a schematic diagram of a photoelectric apparatus of a second embodiment of the present disclosure. The photoelectric apparatus of this embodiment has incorporated some structural modifications in the previous embodiments. One of the structural modifications is application of a transparent conductive layer 103, located on the photoelectric imaging device 100 that light can come in and go out through the transparent conductive layer 103 without difficulty. This transparent conductive layer 103 provides an option to apply external voltage on the transparent conductive layer 103, instead of applying voltage on the photoelectric imaging device 100. In either case, the opposite terminal of the external voltage may be still connected to the side wall of the container 120. In this embodiment, the transparent conductive layer may be a uniform transparent conductive film, or a wire mesh made of transparent or non-transparent electrode materials. The wire mesh per se includes a plurality of small through holes, and the summed area of all the through holes is larger than the summed area of the wires, so that most of the light can pass through.

Figure 6:
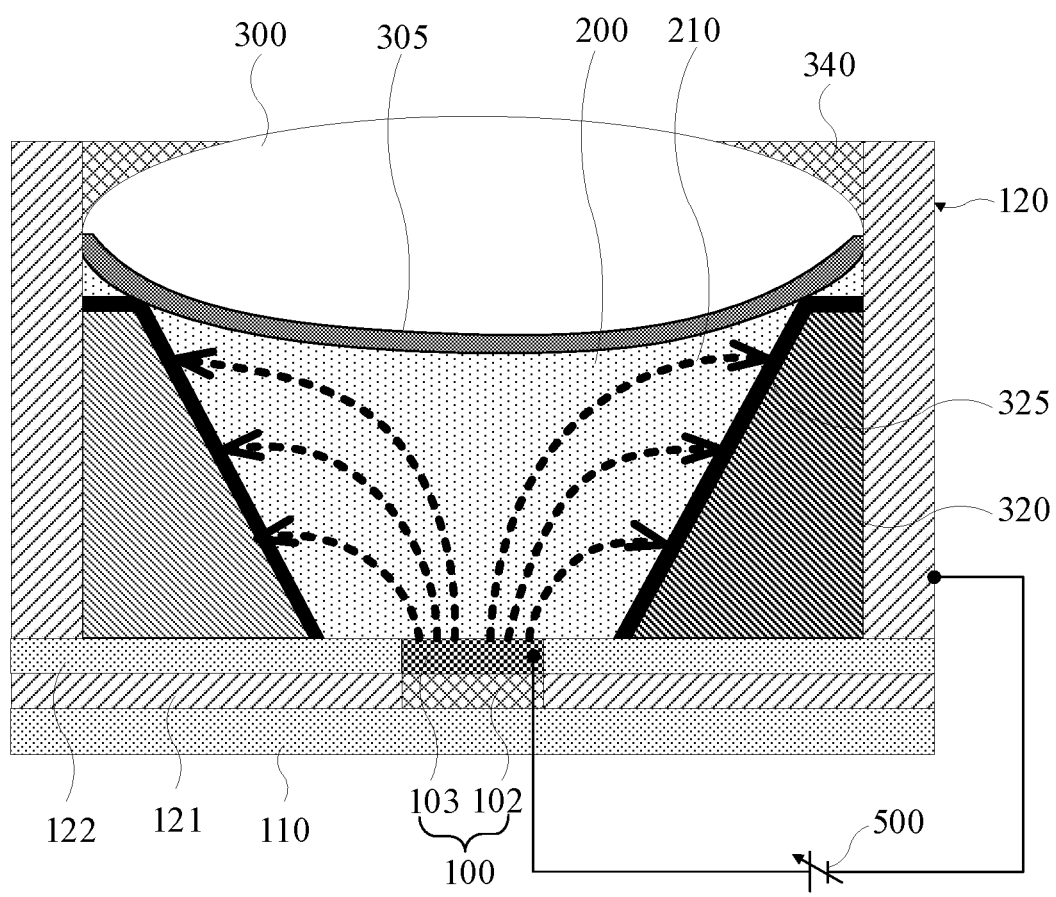
FIG. 6 is a schematic diagram of a photoelectric apparatus of a third embodiment of the present disclosure.

FIG. 6 schematically illustrates a third embodiment, where a transparent electrode layer 305 is coated on the surface of the optical lens 300 facing the heat-conductive liquid 200. The transparent electrode layer 305 not only transmits light but also conducts electricity and heat. The electric field lines in the heat-conductive liquid 200, and so do the nanorod chains which follow the electric field lines, can link the transparent conductive layer 103 and the transparent electrode layer 305, resulting in a further improvement in heat dissipation efficiency.

Figure 7:
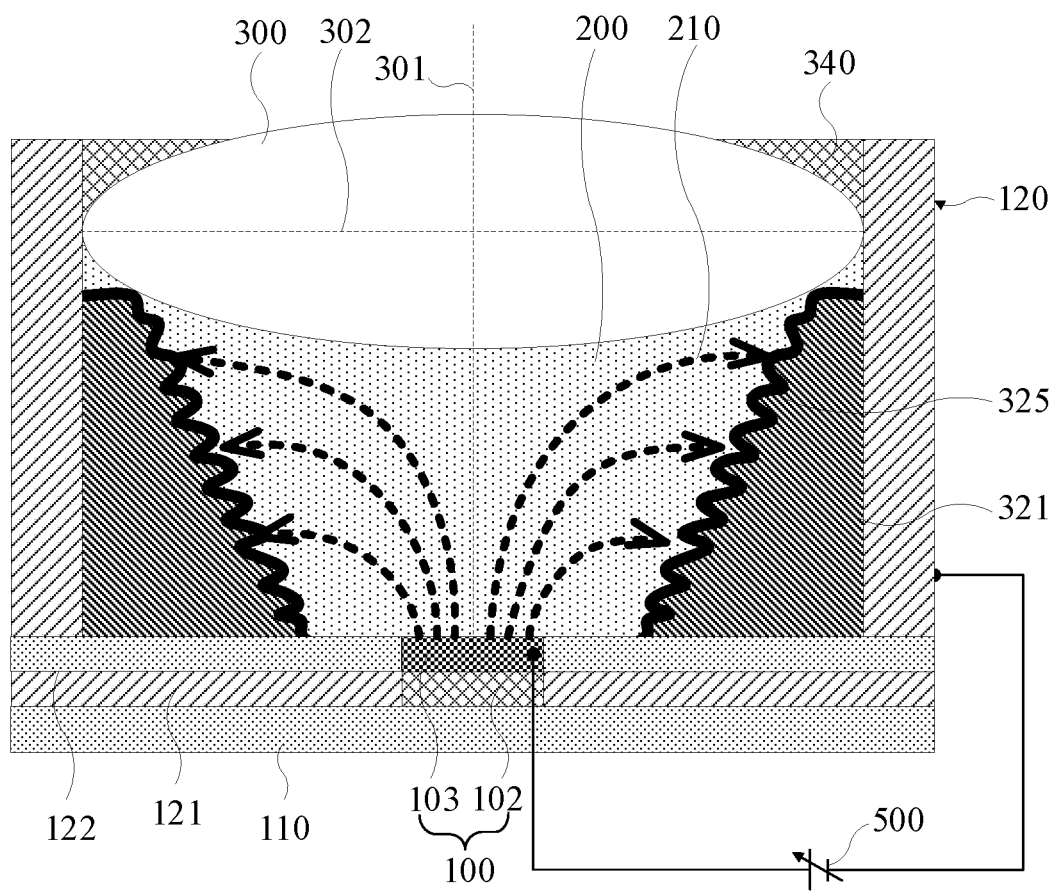
FIG. 7 is a schematic diagram of a photoelectric apparatus of a fourth embodiment of the present disclosure.

FIG. 7 is a schematic diagram of a photoelectric apparatus in another embodiment of the present disclosure. The side wall surface of the aperture structure 321, which is facing the heat-conductive liquid 200, includes a plurality of grooves as illustrated in FIG. 7, or alternatively (not shown in FIG. 7) a plurality of dimples or bumps, periodically or randomly arranged on the side wall surface. In some embodiments, a roughness of the surface of the aperture structure 321 is greater than 1.25. The surface roughness hereinafter is defined as the ratio of the actual contact area with the heat conductive liquid 200 to the projecting area of the surface in the direction perpendicular to the surface. Preferably, the geometric dimensions of the surface roughness, more specifically the gaps between adjacent grooves and their depth, or the transverse span (e.g., length/diameter) and depth of the dimples or bumps are less than 0.5 mm, so as to avoid the effect on the light output due to the rough surface. Increase of surface roughness equivalently increases contact area with the heat-conductive liquid and therefore raises the heat exchange efficiency. In the embodiment illustrated in FIG. 7, a light-absorbing layer 325 is provided on the roughed surface of the aperture structure 321. The material of the light-absorbing layer 325 may be the materials disclosed in other embodiment of the present disclosure. The transparent conductive layer 103 in this embodiment can be replaced with a transparent protecting film or a glass cover described in the present disclosure.

Figure 8:
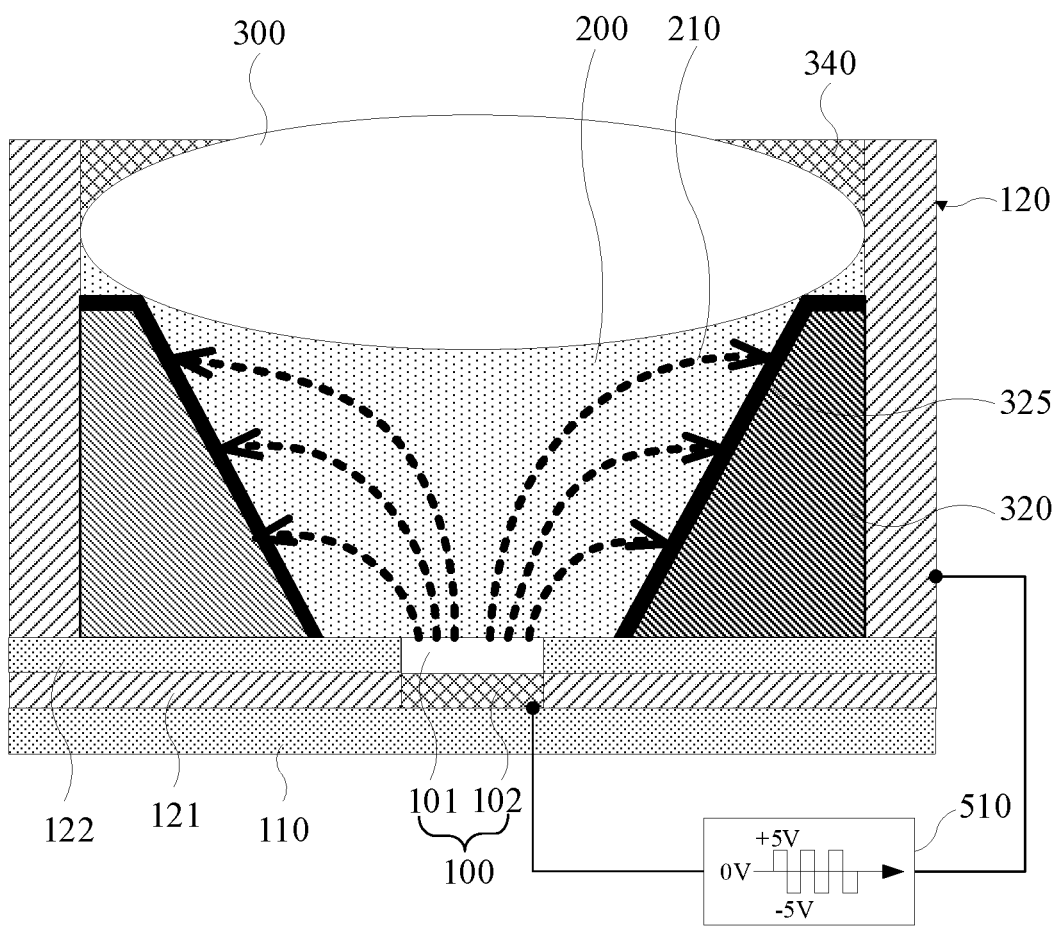
FIG. 8 is a schematic diagram of a photoelectric apparatus of a fifth embodiment of the present disclosure.

Referring to FIG. 8, another embodiment is schematically illustrated in this diagram, which is configured with an external pulse generator 510 for driving the photoelectric imaging apparatus. The components and structural variations disclosed in the previous embodiments can be incorporated and combined in this embodiment. The pulse generator 510 applies a periodic pulse voltage to the heat-conductive liquid which is filled the space between the photoelectric imaging device 100 and the side wall of the container 120. The waveform of the periodic pulse includes a positive pulse and a negative pulse as illustrated in the diagram symbol of the pulse generator 510, and the average voltage is approximately zero volts. The amplitude of these pulses should be large enough to generate a strong electric field in the heat-conductive liquid to cause the nanorods 210 forming nanorod chains. However, the pulse width should be much shorter than the drifting time of the charged ions or the charged nanorods 210 moving from one electrode to the opposite electrode. Under the appropriate pulse voltage, the charged nanorods 210 can rotate and line-up along the electric field lines under the higher frequency pulses, but will essentially not drift toward/to the positive or negative electrodes in the heat-conductive liquid. This is because that the polarity of the electric field is reversed before the charged nanorods moving a certain distance towards a direction to the positive or negative electrode. On the other hand, the pulse frequency should not be too high so that the nanorods 210 is allowed to have sufficient time to rotate 180 degrees and line-up along the electric field lines.

In an embodiment of the waveform of the driving pulse, the positive pulse is 5V, the voltage of the negative pulse is −5V, and the width of the positive and negative pulses are both one millisecond, in other words, the pulse frequency is 500 Hz. The parameters of the waveform of the pulse are just exemplary. In practical applications, depending on the size of the container, the size of the nanorods 210, the moving speed of the nanorods 210 in the heat-conductive liquid 200, the charge amount of the nanorods 210, the material of the nanorods 210 and the structure of the device, the ideal frequency of the pulse can range from ten hertz (Hz) to several hundred kilohertz (KHz), the amplitude of the pulse can range from a few volts to tens of volts, and the pulse waveform can be a square wave as shown in FIG. 8 or other shapes, such as a sine wave. Furthermore, in other embodiments, the average voltage of the pulse waveform may not be zero but have a DC bias voltage. This is to compensate a built-in electric field or bias voltage in the heat-conductive liquid, caused by different drifting speed of different conductive particles, or caused by asymmetric electrodes. A pulse waveform with the DC bias is supplied by the power module 510, and either positive or negative DC bias voltage or potential offset are available for different photoelectric imaging apparatus.

In the various embodiments described above, the DC bias voltage and/or the pulse amplitude supplied by the power module 500/510 are variable to accommodate different requirements for the thermal conductivity of the heat-conductive liquid. Pulse waveform with certain pulse amplitude and DC bias voltage is applied to the heat-conductive liquid for an enhanced thermal conductivity, while removing any DC bias and pulse voltage on the heat-conductive liquid will create a less thermal conductive or even heat insulating liquid to prevent heat exchanging between the photoelectric imaging device and external environment or between the filled liquid and external environment, when the environment temperature is extremely high or low. Therefore, the photoelectric apparatuses in the present disclosure can operate in a broad environment temperature range by modifying the output pulse waveform of the power module 500/510.

The above descriptions of the present disclosure are given in connection with some specific and preferred embodiments, other embodiments within the scope of the concept of the present invention are not limited to the above descriptions. Modifications and substitutions can be made without departing from the spirit and scope of the present disclosure.

What is claimed is:
1. A photoelectric apparatus comprising:
a barrel-shaped container;
a light-transmitting and heat-conductive liquid filled in the container, wherein the heat-conductive liquid contains a plurality of nanostructures;
an optical lens arranged at one end of the container, and one side of the optical lens is in contact with the heat-conductive liquid;
a photoelectric imaging device arranged at another end of the container, the photoelectric imaging device comprising a functional layer and a transparent protecting layer, the transparent protecting layer contacts the heat-conductive liquid; and
a power module for applying a variable voltage between the photoelectric imaging device and the container, wherein the voltage is used to change a spatial morphology of the nanostructures in the heat-conductive liquid;
wherein a principal plane of the optical lens is parallel to the functional layer of the photoelectric imaging device, and an optical axis of the optical lens passes through a center of the functional layer of the photoelectric imaging device.

2. The photoelectric apparatus according to claim 1, wherein the nanostructures comprise a plurality of nanorods, an average diameter-to-length ratio of the nanorods is less than 0.75, and a length of the nanorod is less than 200 nm.

3. The photoelectric apparatus according to claim 2, wherein the nanostructures further comprise a plurality of nanoparticles, a diameter of the nanoparticles is less than 200 nm, and a volume ratio of the nanoparticles in the heat-conductive liquid is smaller than a volume ratio of the nanorods in the heat-conductive liquid.

4. The photoelectric apparatus according to claim 2, wherein the nanorod includes a first end and a second end, and an average diameter of the first ends is larger than an average diameter of the second ends.

5. The photoelectric apparatus according to claim 1, wherein a main composition of the heat-conductive liquid is pure water, a mixed solution of pure water and antifreeze, or a silicone oil.

6. The photoelectric apparatus according to claim 1, wherein materials of the nanostructures comprise metals, metal oxides or insulating materials, the metals are selected from a group including gold, silver, copper or aluminum, the metal oxides are selected from a group including titanium dioxide, aluminum oxide or copper monoxide, and the insulating materials are inorganic or organic insulating materials.

7. The photoelectric apparatus according to claim 1, wherein the heat-conductive liquid further contains dispersants to make the nanostructures uniformly dispersed within the heat-conductive liquid.

8. The photoelectric apparatus according to claim 1, wherein the transparent protecting layer comprises a transparent insulating layer or a transparent conductive layer;
wherein the power module includes a first electrode connected to a substrate of the photoelectric imaging device or connected to the transparent conductive layer, and a second electrode of the power module connected to the container.

9. The photoelectric apparatus according to claim 1, wherein the optical lens is a convex lens, a concave lens, a plano lens, or a compound lens comprising at least two lens elements of a convex lens, a concave lens and a plano lens.

10. The photoelectric apparatus according to claim 1, wherein the photoelectric apparatus further comprises an aperture structure arranged between the optical lens and the photoelectric imaging device, and the aperture structure is immersed in the heat-conductive liquid;
a center of a light-passing hole of the aperture structure and the optical axis of the optical lens coincide, and the aperture structure is configured to limit a maximum angle of light passing between the optical lens and the photoelectric imaging device.

11. The photoelectric apparatus according to claim 10, wherein the aperture structure is made of metal, and a light-absorbing layer is provided on a surface of the aperture structure on which light enters.

12. The photoelectric apparatus according to claim 10, wherein a surface of the optical lens facing the heat-conductive liquid is covered with a transparent electrode layer, and the transparent electrode layer is electrically connected to the aperture structure or the container.

13. The photoelectric apparatus according to claim 11, wherein a surface of the aperture structure facing the heat-conductive liquid is provided with a plurality of grooves or a plurality of periodically or randomly arranged dimples, and a roughness of the surface of the aperture structure is greater than 1.25, both a transverse span and a depth of the grooves or the dimples are less than 0.5 mm.

14. The photoelectric apparatus according to claim 1, wherein the power module is configured to apply a periodic pulse superimposed on a DC bias voltage, the DC bias voltage can be positive voltage, negative voltage or zero voltage, and the periodic pulse includes a positive pulse and a negative pulse and average voltage is approximately zero volts.

15. The photoelectric apparatus according to claim 1, wherein the photoelectric imaging device comprises a CCD image sensor, a CMOS image sensor, an organic light emitting diode display or an inorganic light emitting diode display.

* * * * *